(12) United States Patent
Miyazaki

(10) Patent No.: US 7,705,638 B2
(45) Date of Patent: Apr. 27, 2010

(54) SWITCHING CONTROL CIRCUIT WITH REDUCED DEAD TIME

(75) Inventor: Katsumi Miyazaki, Itami (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

(21) Appl. No.: 11/130,259

(22) Filed: May 17, 2005

(65) Prior Publication Data
US 2005/0258890 A1  Nov. 24, 2005

(30) Foreign Application Priority Data
May 19, 2004  (JP)  ............... 2004-148780

(51) Int. Cl.
*H03K 3/00*  (2006.01)
(52) U.S. Cl. .................. 327/110; 327/108; 327/112; 326/83; 326/86
(58) Field of Classification Search ............ None
See application file for complete search history.

(56) References Cited

U.S. PATENT DOCUMENTS

| | | | |
|---|---|---|---|
| 5,754,065 A * | 5/1998 | Wong ................... | 327/108 |
| 6,172,550 B1 * | 1/2001 | Gold et al. ............... | 327/366 |
| 6,285,236 B1 * | 9/2001 | Stephens ................. | 327/391 |
| 6,870,354 B2 | 3/2005 | Nishimaki | |
| 6,873,121 B1 * | 3/2005 | Stevens ................. | 315/307 |
| 6,927,607 B2 * | 8/2005 | Choi et al. .............. | 327/108 |
| 6,940,262 B2 * | 9/2005 | Dequina et al. ........... | 323/284 |
| 6,998,824 B2 | 2/2006 | Nishimaki | |
| 2005/0017767 A1 * | 1/2005 | Huang et al. ............. | 327/110 |

FOREIGN PATENT DOCUMENTS

| | | |
|---|---|---|
| JP | 2004-56982 | 2/2004 |
| JP | 2004-56983 | 2/2004 |

OTHER PUBLICATIONS

Asai et al., Transistor Technology, Jul. 1998, Chapters 1-3, vol. 35, No. 406, CQ Publishing Co. Ltd., Tokyo, Japan.
JP Office Action issued on Nov. 10, 2009 in a corresponding application and partial English-language translation (4 pages).

* cited by examiner

*Primary Examiner*—Lincoln Donovan
*Assistant Examiner*—Khareem E. Almo
(74) *Attorney, Agent, or Firm*—Buchanan Ingersoll & Rooney PC

(57) ABSTRACT

A switching control circuit of synchronous rectification type that is capable of reducing dead time is obtained. Upon detection that an output potential rises above VDD-Va, a first sensor outputs an H signal to a first input terminal of a first NOR circuit, and the first NOR circuit outputs an L signal to a second input terminal of a second NOR circuit, and the second NOR circuit outputs an H signal to a first gate driving circuit. A PMOS is thereby turned on. Upon detection that the output potential falls below GND+Vb, a second sensor outputs an L signal to a first input terminal of a first NAND circuit, and the first NAND circuit outputs an H signal to a second input terminal of a second NAND circuit, and the second NAND circuit outputs an L signal to a second gate driving circuit. An NMOS is thereby turned on.

2 Claims, 9 Drawing Sheets

F I G . 4
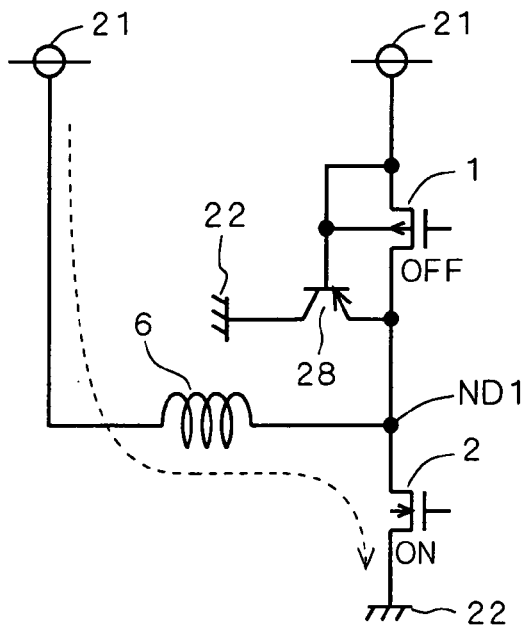
F I G . 5
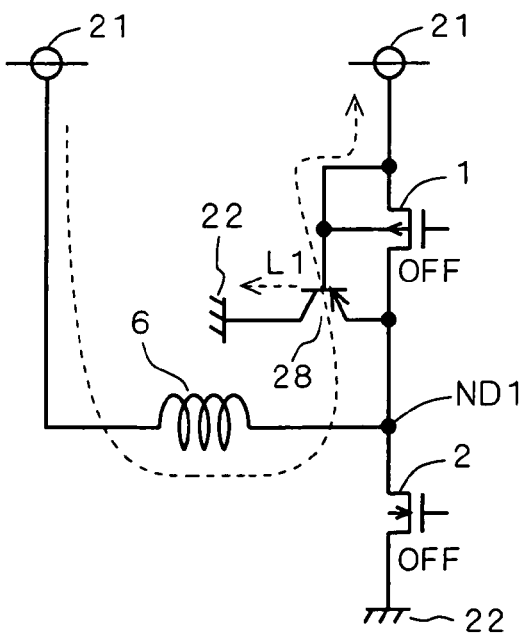

F I G . 1 1
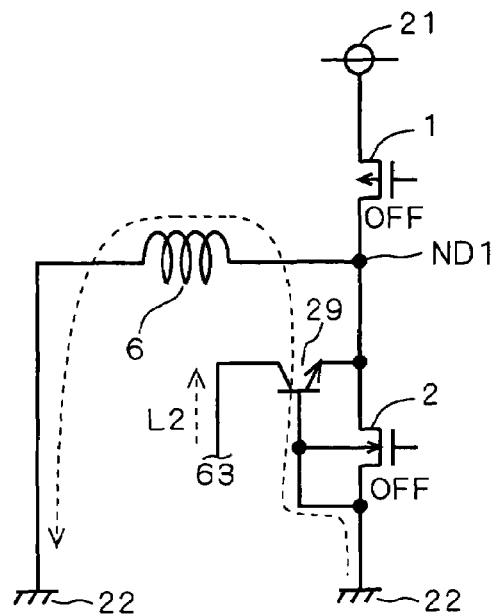
F I G . 1 2
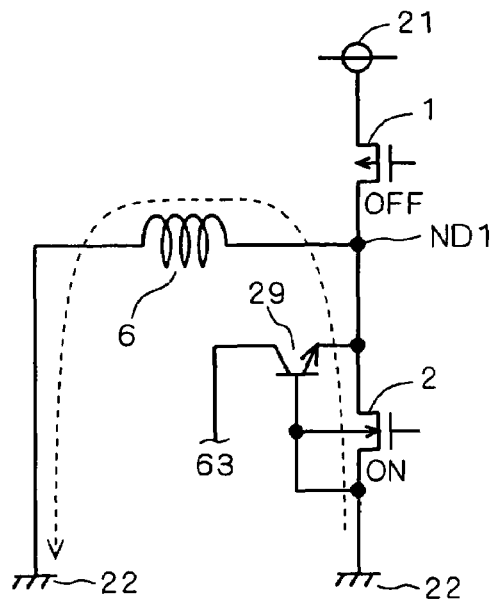

SWITCHING CONTROL CIRCUIT WITH REDUCED DEAD TIME

BACKGROUND OF THE INVENTION

1. Field of the Invention

The present invention relates to a switching control circuit of synchronous rectification type.

2. Description of the Background Art

A main object of synchronous rectification is to reduce power loss produced on a discharge path when discharging an inductive load, by a parasitic diode and the like inside a semiconductor substrate.

When performing synchronous rectification, dead time needs to be provided in order to prevent the occurrence of short-circuit current due to a simultaneous turn-on of an output transistor for supplying load current and an output transistor for attracting load current.

A conventional technique related to such switching control circuit of synchronous rectification type is disclosed in "Transistor Technology, July 1998", Vol. 35, No. 406 published by CQ Publishing Co., Ltd. on Jul. 1, 1998, Chapters 1-3.

An optimum value of dead time needs to be determined with various considerations as it depends on load current, load inductance or slew rate of output voltage. Various methods for determining dead time are known; however, an excessively short dead time will increase the risk that short-circuit current is produced, while an excessively long dead time will cause problems as will be described below.

Consider the case of driving an inductive load such as a coil or a motor using a CMOS transistor made up of a P-channel MOS transistor and an N-channel MOS transistor. In this case, even in a synchronous rectification type circuit, a parasitic bipolar transistor may disadvantageously be activated when an output potential (that is, a drain potential of the P-channel MOS transistor and N-channel MOS transistor) becomes not less than a power supply potential or not more than a GND potential during the dead time under the influence of inductive current in an inductance or a regenerative current in the motor.

In the case of the common source mode in which a bulk node as well as a P-channel MOS transistor and an N-channel MOS transistor are connected to the source, a parasitic vertical PNP bipolar transistor made up of a $P^+$-type drain, an N-type bulk and a $P^-$-type substrate is operated when a drain potential of the P-channel MOS transistor rises sufficiently above a source potential. As a result, a large amount of current flown out of an inductive load leaks into the substrate as collector current of the vertical PNP bipolar transistor, which cannot be used again. This not only reduces energy efficiency at the time of load driving, but also becomes a factor of unnecessary heat generation in an integrated circuit and a factor of an operation of a parasitic thyristor (a so-called latch-up) triggered by a substrate potential raised by the collector current of the vertical PNP bipolar transistor.

Further, when the drain potential of the N-channel MOS transistor falls sufficiently below the source potential, a parasitic NPN bipolar transistor made up of an $N^+$-type drain, an P-type bulk and a N-type well adjacent to the bulk is operated. As a result, the P-type bulk attracts electric charge from the N-type well, which may not only reduce energy efficiency and cause unnecessary heat generation as described above, but may also cause malfunction of a circuit near the N-channel MOS transistor.

Accordingly, the dead time needs to be reduced to a minimum, particularly when driving a CMOS transistor by synchronous rectification.

SUMMARY OF THE INVENTION

An object of the present invention is to obtain a switching control circuit of synchronous rectification type that is capable of reducing dead time.

According to a first aspect of the present invention, the switching control circuit includes a first switching device, a second switching device, an inductive load, a detecting circuit and a first driving circuit. The first switching device is connected to a power supply potential. The second switching device is connected to a GND potential. The inductive load is connected to a node between the first and second switching devices. The detecting circuit detects an output potential which is a potential at the node. The first driving circuit receives a first signal from the detecting circuit when turning on the first switching device after turning off the second switching device, thereby turning on the first switching device. The first signal indicates that the output potential rises above a first potential lower than the power supply potential by a predetermined value.

The dead time can be reduced.

According to a second aspect of the invention, the switching control circuit includes a first switching device, a second switching device, an inductive load, a detecting circuit and an impedance switching circuit. The first switching device is connected to a power supply potential. The second switching device is connected to a GND potential. The inductive load is connected to a node between the first and second switching devices. The detecting circuit detects an output potential which is a potential at the node. The impedance switching circuit receives a signal from the detecting circuit when turning on the first switching device after turning off the second switching device, thereby switching a driving impedance of the first switching device from a first value to a second value lower than the first value. The signal indicates that the output potential rises above a potential lower than the power supply potential by a predetermined value.

The dead time can be reduced.

According to a third aspect of the invention, the switching control circuit includes a first switching device, a second switching device, an inductive load, a detecting circuit and a driving circuit. The first switching device is connected to a power supply potential. The second switching device is connected to a GND potential. The inductive load is connected to a node between the first and second switching devices, a detecting circuit for detecting an output potential which is a potential at the node. The driving circuit receives a signal from the detecting circuit when turning on the second switching device after turning off the first switching device, thereby turning on the second switching device. The signal indicates that the output potential falls below a potential higher than the GND potential by a predetermined value.

The dead time can be reduced.

According to a fourth aspect of the invention, the switching control circuit includes a first switching device, a second switching device, an inductive load, a detecting circuit and an impedance switching circuit. The first switching device is connected to a power supply potential. The second switching device is connected to a GND potential. The inductive load is connected to a node between the first and second switching devices. The detecting circuit detects an output potential which is a potential at the node. The impedance switching circuit receives a signal from the detecting circuit when turning on the second switching device after turning off the first switching device, thereby switching a driving impedance of the second switching device from a first value to a second value lower than the first value. The signal indicates that the output potential falls below a potential higher than the GND potential by a predetermined value.

The dead time can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 to 6 are circuit diagrams each showing an example of a path of load current;

FIGS. 10 to 12 are circuit diagrams each showing an example of a path of load current;

DESCRIPTION OF THE PREFERRED EMBODIMENTS

Figure 1:
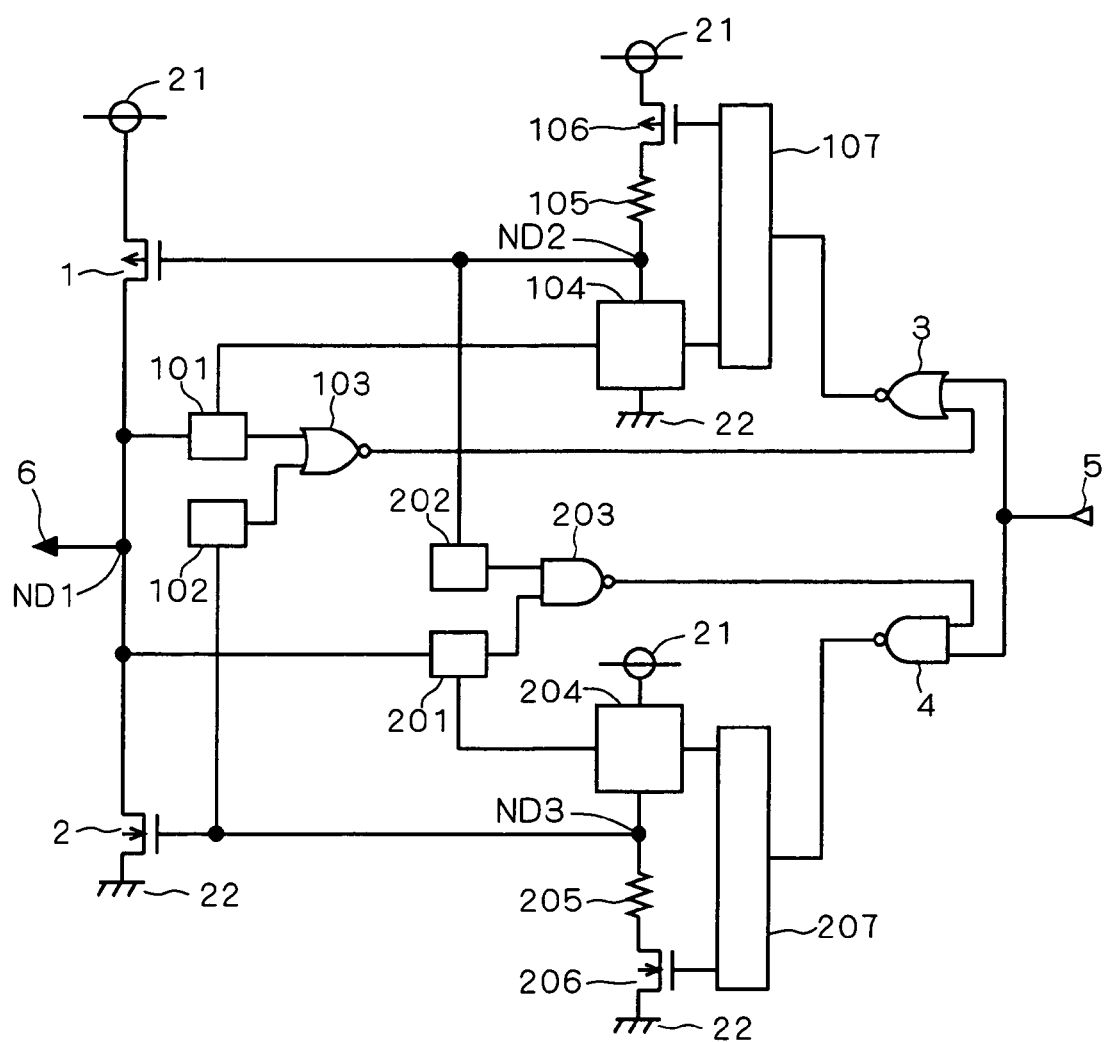
FIG. 1 is a circuit diagram showing the configuration of a switching control circuit according to a preferred embodiment of the present invention.

FIG. 1 is a circuit diagram showing the configuration of a switching control circuit according to a preferred embodiment of the present invention. A P-channel MOS transistor (hereinafter referred to as "PMOS") 1 serving as a first switching device has its source connected to a power supply potential (VDD) 21. The PMOS 1 has its drain connected to the drain of an N-channel MOS transistor (hereinafter referred to as "NMOS") 2 serving as a second switching device. The NMOS 2 has its source connected to a GND potential 22. An inductive load 6 such as a coil is connected to a node ND1 between the PMOS 1 and NMOS 2. The potential at the node ND1 is an output potential of a CMOS transistor made up of the PMOS 1 and NMOS 2. The PMOS 1 and NMOS 2 are transistors for driving the inductive load 6, and more specifically, the PMOS 1 is a transistor for supplying load current, and the NMOS 2 is a transistor for attracting load current.

A driving pulse signal is input to a signal input terminal 5 from outside. The signal input terminal 5 is connected to a first input terminal of a NOR circuit 3 and a first input terminal of a NAND circuit 4.

A sensor 101 has its input terminal connected to the node ND1. The sensor 101 detects the potential at the node ND1, and outputs an H (high) signal when it detects that the potential at the node ND1 rises above VDD-Va. The potential Va is an arbitrary value previously determined to range between the GND potential 22 and power supply potential 21. For instance, when VDD is 5.0 V, VDD-Va is set at 4.3 V. The sensor 101 may have any circuit configuration, and for example, may be configured using a MOS transistor having a threshold voltage Vth between the gate and source of a MOS transistor set at VDD-Va.

The sensor 101 has its output terminal connected to a first input terminal of a NOR circuit 103 and an impedance switching circuit 104.

The NOR circuit 103 has its second input terminal connected to an output terminal of a sensor 102 for detecting the gate voltage of the NMOS 2. The sensor 102 is configured to output an H signal when the gate voltage of the NMOS 2 falls below a predetermined value. The NOR circuit 103 has its output terminal connected to a second input terminal of the NOR circuit 3.

The NOR circuit 3 has its output terminal connected to a gate driving circuit 107 for controlling the gate voltage of the PMOS 1. A PMOS 106 has its source connected to the power supply potential 21, and its drain connected to a first end of a resistance 105. The resistance 105 is intended to ease the rising speed of the gate voltage of the PMOS 1, thereby avoiding a sudden turn-off of the PMOS 1. The PMOS 106 has its gate connected to the gate driving circuit 107. The resistance 105 has its second end connected to the impedance switching circuit 104 through a node ND2. The impedance switching circuit 104 is also connected to the gate driving circuit 107 and GND potential 22. The node ND2 is connected to the gate of the PMOS 1.

Figure 2:
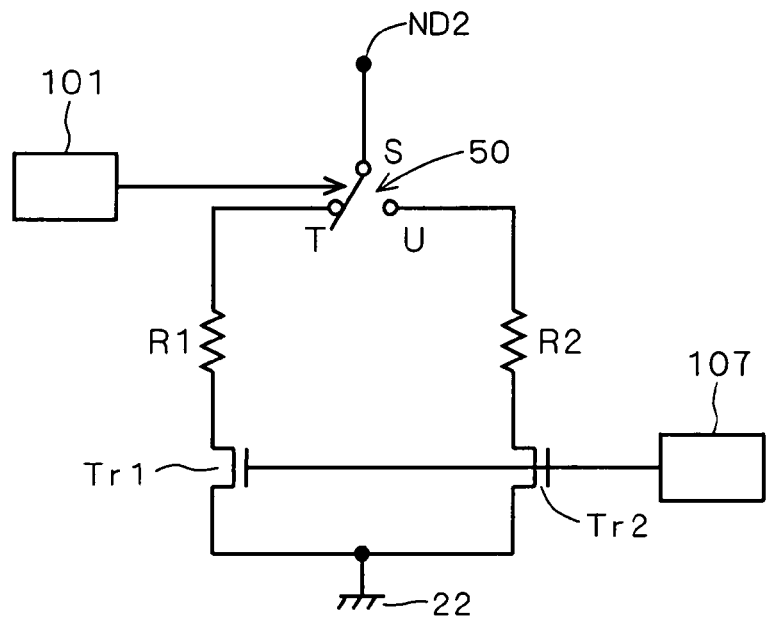
FIGS. 2 and 3 are circuit diagrams each showing the configuration of an impedance switching circuit.

The impedance switching circuit 104 may have any configuration, and for example, as shown in FIG. 2, may be configured such that a series connection of a resistance R1 and a MOS transistor Tr1 and a series connection of a resistance R2 (>R1) and a MOS transistor Tr2 are connected in parallel between the node ND2 and GND potential 22, so that a switch 50 is switched between terminals T and U by a signal output from the sensor 101. In FIG. 2, the terminals S and T of the switch 50 are connected when an H signal is received from the sensor 101, and the terminals S and U of the switch 50 are connected when an L (low) signal is received from the sensor 101. That is, upon receipt of an H signal from the sensor 101, the impedance switching circuit 104 switches a driving impedance for dropping the gate voltage of the PMOS 1 from the resistance R2 to the resistance R1 lower than the resistance R2. Although the two MOS transistors Tr1 and Tr2 are used here by way of example as shown in FIG. 2, the resistance R2 may be connected to the MOS transistor Tr1 omitting the formation of the MOS transistor Tr2, for example.

Referring to FIGS. 1 and 2, the gate driving circuit 107 turns on the MOS transistors Tr1 and Tr2 when an H signal is input from the NOR circuit 3. The PMOS 1 is thereby turned on. When an L signal is input from the NOR circuit 3, the gate driving circuit 107 turns on the PMOS 106. The PMOS 1 is thereby turned off. If only such functions are achieved, the gate driving circuit 107 may have any configuration.

A sensor 201 has its input terminal connected to the node ND1. The sensor 201 detects the potential at the node ND1, and outputs an L signal when it detects that the potential at the node ND1 falls below GND+Vb. The potential Vb is an arbitrary value previously determined to range between the GND potential 22 and power supply potential 21. For instance, when GND is 0 V, GND+Vb is set at 0.7 V. The sensor 201 may have any circuit configuration, and for example, may be configured using a MOS transistor having a threshold voltage Vth between the gate and source of a MOS transistor set at GND+Vb.

The sensor 201 has its output terminal connected to a first input terminal of a NAND circuit 203 and an impedance switching circuit 204.

The NAND circuit 203 has its second input terminal connected to an output terminal of a sensor 202 for detecting the gate potential of the PMOS 1. The sensor 202 is configured to output an L signal when the gate voltage of the PMOS 1 rises above a predetermined value. The NAND circuit 203 has its output terminal connected to a second input terminal of the NAND circuit 4.

The NAND circuit 4 has its output terminal connected to a gate driving circuit 207 for controlling the gate voltage of the NMOS 2. An NMOS 206 has its source connected to the GND potential 22, and its drain connected to a first end of a resistance 205. The resistance 205 is intended to ease the dropping speed of the gate voltage of the NMOS 2, thereby avoiding a sudden turn-off of the NMOS 2. The NMOS 206 has its gate connected to the gate driving circuit 207. The resistance 205 has its second end connected to the impedance switching circuit 204 through a node ND3. The impedance switching circuit 204 is also connected to the gate driving circuit 207 and power supply potential 21. The node ND3 is connected to the gate of the NMOS 2.

Figure 3:
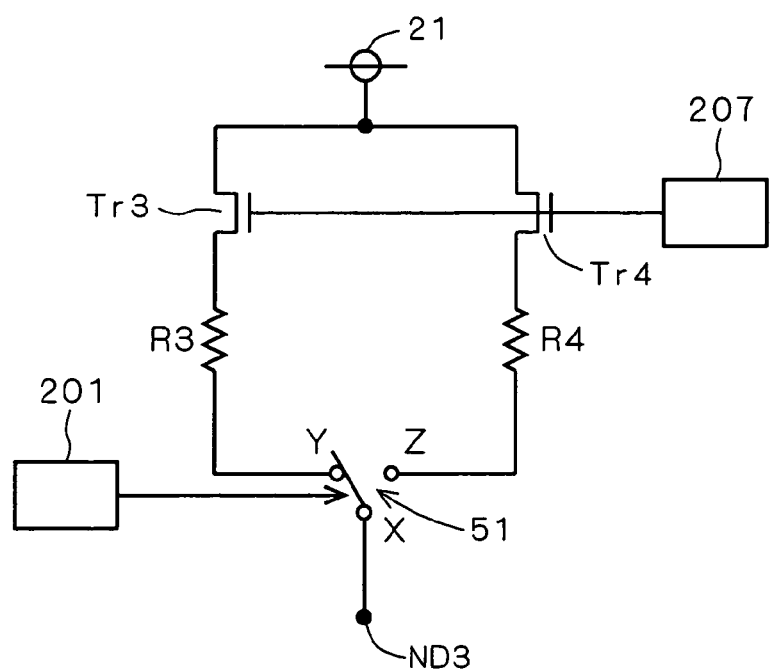

The impedance switching circuit 204 may have any configuration, and for example, as shown in FIG. 3, may be configured such that a series connection of a resistance R3 and a MOS transistor Tr3 and a series connection of a resistance R4 (>R3) and a MOS transistor Tr4 are connected in parallel between the node ND3 and power supply potential 21, so that a switch 51 is switched between terminals Y and Z by a signal output from the sensor 201. In FIG. 3, the terminals X and Y of the switch 51 are connected when an L signal is received from the sensor 201, and the terminals X and Z of the switch 51 are connected when an H signal is received from the sensor 201. That is, upon receipt of an L signal from the sensor 201, the impedance switching circuit 204 switches a driving impedance for raising the gate voltage of the NMOS 2 from the resistance R4 to the resistance R3 lower than the resistance R4. Although the two MOS transistors Tr3 and Tr4 are used here by way of example as shown in FIG. 3, the resistance R4 may be connected to the MOS transistor Tr3 omitting the formation of the MOS transistor Tr4, for example.

Referring to FIGS. 1 and 3, the gate driving circuit 207 turns on the MOS transistors Tr3 and Tr4 when an L signal is received from the NAND circuit 4. The NMOS 2 is thereby turned on. When an H signal is received from the NAND circuit 4, the gate driving circuit 207 turns on the NMOS 206. The NMOS 2 is thereby turned off. If only such functions are achieved, the gate driving circuit 207 may have any configuration.

Operations will be described now.

First, an operation for turning on the PMOS 1 after turning off the NMOS 2 having been in an on state will be described.

Figure 6:
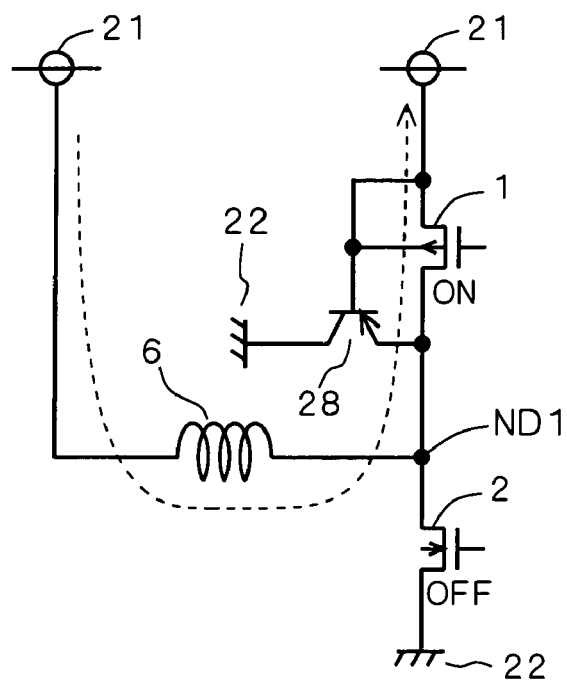
Figure 7:
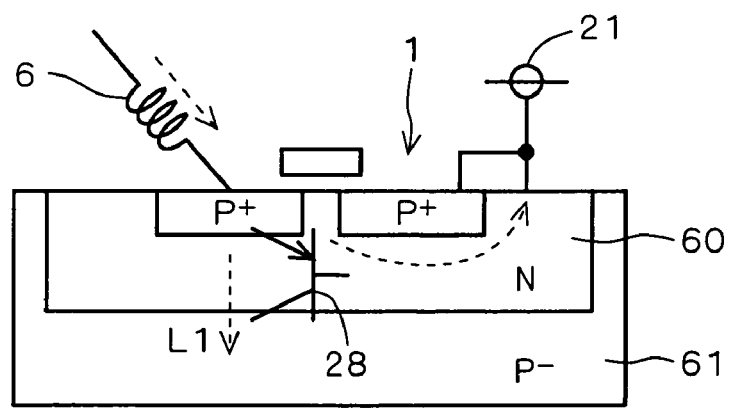
FIG. 7 is a sectional view showing the structure of PMOS.

FIGS. 4 to 6 each show an example of a path of load current in switching-driving of the inductive load 6 by pulse width modulation or the like. FIG. 4 shows the PMOS 1 in an off state and the NMOS 2 in an on state. FIG. 5 shows the NMOS 2 brought into an off state thereafter. FIG. 6 shows the PMOS 1 brought into an on state thereafter. A bipolar transistor 28 shown in FIGS. 4 to 6 is a parasitic vertical PNP bipolar transistor made up of a $P^+$-type drain, an N-type bulk 60 and a $P^-$-type substrate 61 as shown in FIG. 7.

Figure 8:
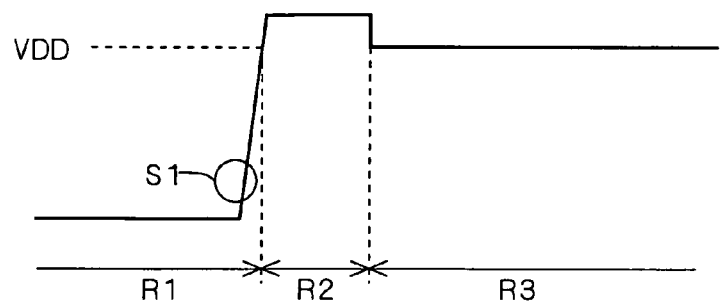
FIG. 8 is a waveform chart of an output potential when the invention is not applied.
Figure 9:
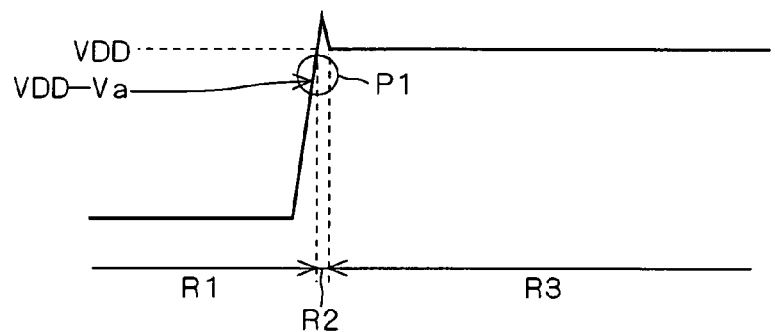
FIG. 9 is a waveform chart of an output potential when the invention is applied.

FIG. 8 is a waveform chart of an output potential (the potential at the node ND1) when the present invention is not applied, and FIG. 9 is a waveform chart of an output potential when the invention is applied.

When the NMOS 2 for attracting load current is turned off, the output potential starts rising (at S1 shown in FIG. 8) because of the load current flown out of the inductive load 6.

Generally, some restrictions are imposed on the slew rate of an output potential in many cases. Therefore, switching of operation from the NMOS 2 to PMOS 1 is not conducted instantaneously.

Known as a general method of achieving a gentle slew rate is previously setting a driving impedance (resistance 205 shown in FIG. 1) for dropping the gate voltage of the NMOS 2 at a large value to a certain degree and making use of gate-to-drain capacitive coupling of the NMOS 2, thereby limiting the dropping speed of the gate voltage of the NMOS 2. With this method, variations in on-state resistance of the NMOS 2 become gentle, and the load current flown out of the inductive load 6 is shunted to flow into the PMOS 1 and NMOS 2 for a certain period of time, which avoids an abrupt rise in output potential.

At this time, in order to avoid a simultaneous turn-on of the PMOS 1 and NMOS 2, circuits (sensor 102 and NOR circuit 3 shown in FIG. 1) for permitting the turn-on of the PMOS 1 after confirming the turn-off of the NMOS 2 by detection of the gate voltage of the NMOS 2 are functioning. However, since the dropping speed of the gate voltage of the NMOS 2 is limited as described above, the detection of the turn-off of the NMOS 2 by the sensor 102 is delayed, resulting in a delay in the operation of turning on the PMOS 1. Meanwhile, the load current flown out of the inductive load 6 flows into the substrate 61 as indicated by an arrow L1 shown in FIGS. 5 and 7. A period R2 shown in FIG. 8 corresponds to this period, during which various problems arise such as reduction in energy efficiency, heat generation in an integrated circuit and latch-up as described above.

In contrast, according to the present invention, the PMOS 1 is turned on by detecting that the output potential rises above VDD-Va by the sensor 101 without waiting for the detection of the turn-off of the NMOS 2 by the sensor 102. More specifically, upon detection that the output potential rises above VDD-Va, the sensor 101 outputs an H signal to the first input terminal of the NOR circuit 3, and the NOR circuit 103 outputs an L signal to the second input terminal of the NOR circuit 3, and the NOR circuit 3 outputs an H signal to the gate driving circuit 107. The MOS transistors Tr1 and Tr2 shown in FIG. 2 are thereby turned on, causing the PMOS 1 to be turned on.

Therefore, as is apparent from a comparison between the charts shown in FIGS. 8 and 9, the period R2 is shorter in the case where the present invention is applied (FIG. 9) than in the case where the present invention is not applied (FIG. 8). Thus, the present invention achieves reduction in dead time while ensuring a desired slew rate, which can avoid the occurrence of various problems such as reduction in energy efficiency, heat generation in an integrated circuit and latch-up.

Further, referring to FIG. 2, when the sensor 101 detects that the output potential rises above VDD-Va, the impedance switching circuit 104 having received an H signal from the sensor 101 switches the driving impedance for dropping the gate voltage of the PMOS 1 from the resistance R2 to the resistance R1 lower than the resistance R2. As a result, the PMOS 1 can be turned on at an early stage, which can effectively avoid the occurrence of the above-mentioned various problems.

Next, an operation for turning on the NMOS 2 after turning off the PMOS 1 having been in an on state will be described.

Figure 10:
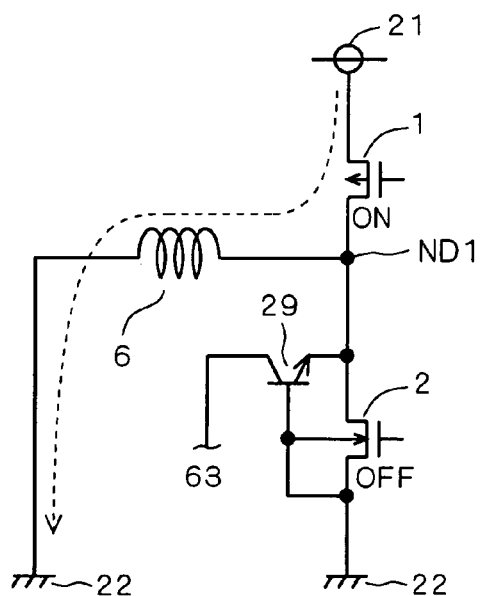
Figure 13:
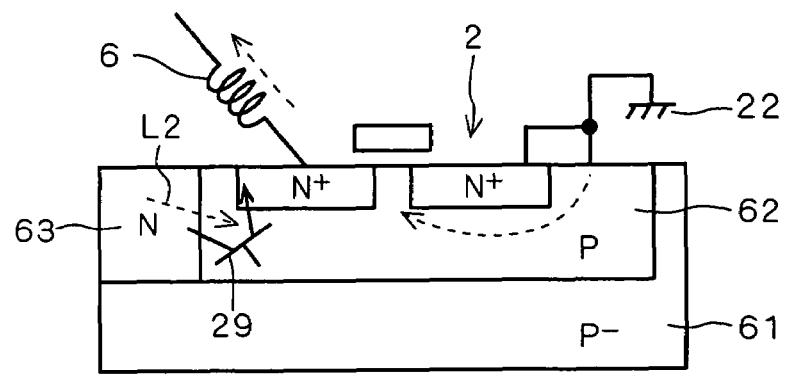
FIG. 13 is a sectional view showing the structure of NMOS.

FIGS. 10 to 12 each show an example of a path of load current. FIG. 10 shows the NMOS 2 in an off state and the PMOS 1 in an on state. FIG. 11 shows the PMOS 1 brought into an off state thereafter. FIG. 12 shows the NMOS 2 brought into an on state thereafter. A bipolar transistor 29 shown in FIGS. 10 to 12 is a parasitic NPN bipolar transistor made up of an N+-type drain, a P-type bulk 62 and an N-type well 63 adjacent to the bulk 62 as shown in FIG. 13.

Figure 14:
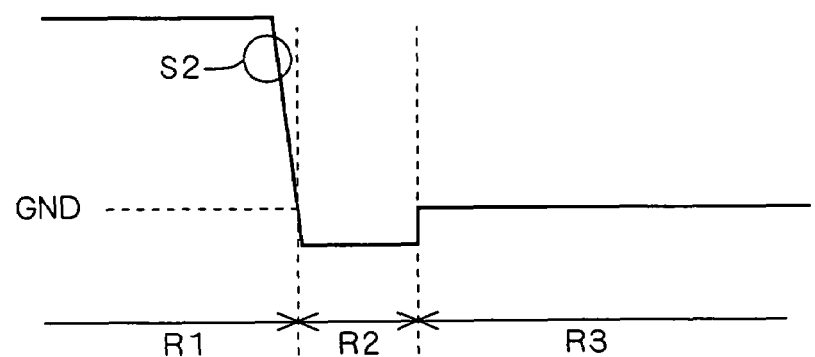
FIG. 14 is a waveform chart of an output potential when the invention is not applied.
Figure 15:
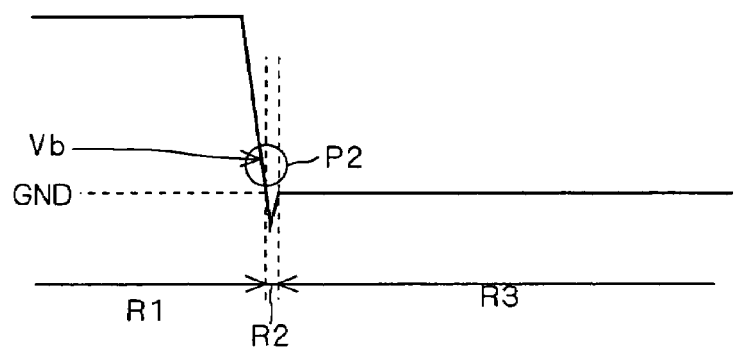
FIG. 15 is a waveform chart of an output potential when the invention is applied.

FIG. 14 is a waveform chart of an output potential (the potential at the node ND1) when the present invention is not applied, and FIG. 15 is a waveform chart of an output potential when the invention is applied.

When the PMOS 1 for supplying load current is turned off, the output potential starts dropping (at S2 shown in FIG. 14) because of the load current flown out of the node ND1 into the inductive load 6. Generally, some restrictions are imposed on the slew rate of an output potential in many cases. Therefore, switching of operation from the PMOS 1 to NMOS 2 is not conducted instantaneously.

Known as a general method of achieving a gentle slew rate is previously setting a driving impedance (resistance 105 shown in FIG. 1) for raising the gate voltage of the PMOS 1 at a large value to a certain degree and making use of gate-to-drain capacitive coupling of the PMOS 1, thereby limiting the rising speed of the gate voltage of the PMOS 1. With this method, variations in on-state resistance of the PMOS 1 become gentle, and the load current to flow into the inductive load 6 is shunted to flow through the PMOS 1 and NMOS 2 for a certain period of time, which avoids an abrupt drop in output potential.

At this time, in order to avoid a simultaneous turn-on of the PMOS 1 and NMOS 2, circuits (sensor 202 and NAND circuit 4 shown in FIG. 1) for permitting the turn-on of the NMOS 2 after confirming the turn-off of the PMOS 1 by detection of the gate voltage of the PMOS 1 are functioning. However, since the rising speed of the gate voltage of the PMOS 1 is limited as described above, the detection of the turn-off of the PMOS 1 by the sensor 202 is delayed, resulting in a delay in the operation of turning on the NMOS 2. Meanwhile, the load current flown into the inductive load 6 is attracted by the well 63 as indicated by an arrow L2 shown in FIGS. 11 and 13. A period R2 shown in FIG. 14 corresponds to this period, during which various problems arise such as reduction in energy efficiency, heat generation in an integrated circuit and malfunction of a circuit near the NMOS 2 as described above.

In contrast, according to the present invention, the NMOS 2 is turned on by detecting that the output potential falls below GND+Vb by the sensor 201 without waiting for the detection of the turn-off of the PMOS 1 by the sensor 202. More specifically, upon detection that the output potential falls below GND+Vb, the sensor 201 outputs an L signal to the first input terminal of the NAND circuit 203, and the NAND circuit 203 outputs an H signal to the second input terminal of the NAND circuit 4, and the NAND circuit 4 outputs an L signal to the gate driving circuit 207. The MOS transistors Tr3 and Tr4 shown in FIG. 3 are thereby turned on, causing the NMOS 2 to be turned on.

Therefore, as is apparent from a comparison between the charts shown in FIGS. 14 and 15, the period R2 is shorter in the case where the present invention is applied (FIG. 15) than in the case where the present invention is not applied (FIG. 14). Thus, the present invention achieves reduction in dead time while ensuring a desired slew rate, which can avoid the occurrence of various problems such as reduction in energy efficiency, heat generation in an integrated circuit and malfunction of a circuit near the NMOS 2.

Further, referring to FIG. 3, when the sensor 201 detects that the output potential falls below GND+Vb, the impedance switching circuit 204 having received an L signal from the sensor 201 switches the driving impedance for raising the gate voltage of the NMOS 2 from the resistance R4 to the resistance R3 lower than the resistance R4. As a result, the NMOS 2 can be turned on at an early stage, which can effectively avoid the occurrence of the above-mentioned various problems.

In the case of a light load current or no load, influences of a rise or drop in output potential caused by load current can be neglected. Therefore, the mechanism made up of the sensors 101 and 201 is not operated, and a similar operation as in the mechanism made up of the sensors 102 and 202 is performed.

Figure 16:
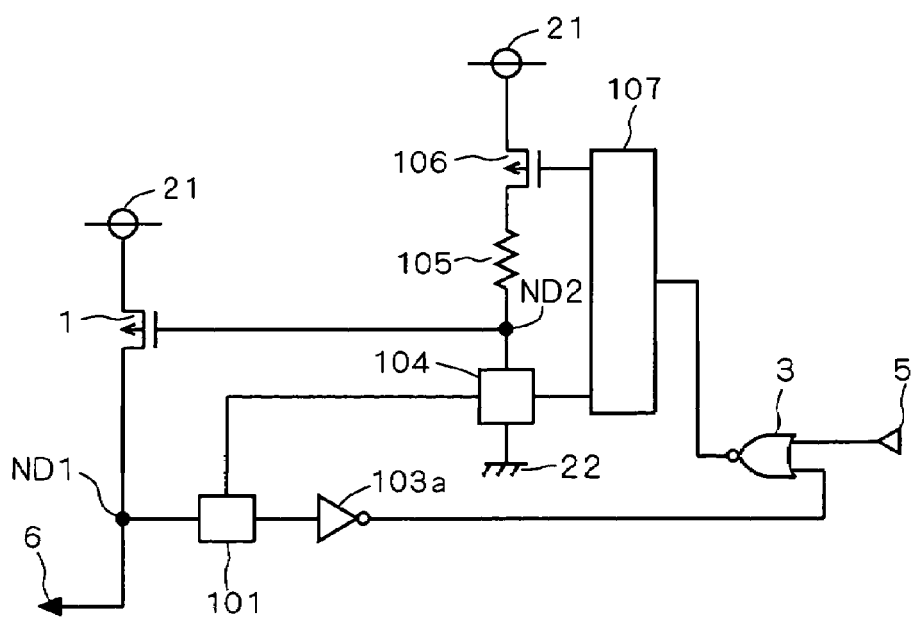
FIGS. 16 and 17 are circuit diagrams each showing a partial circuit of the switching control circuit shown in FIG. 1.
Figure 17:
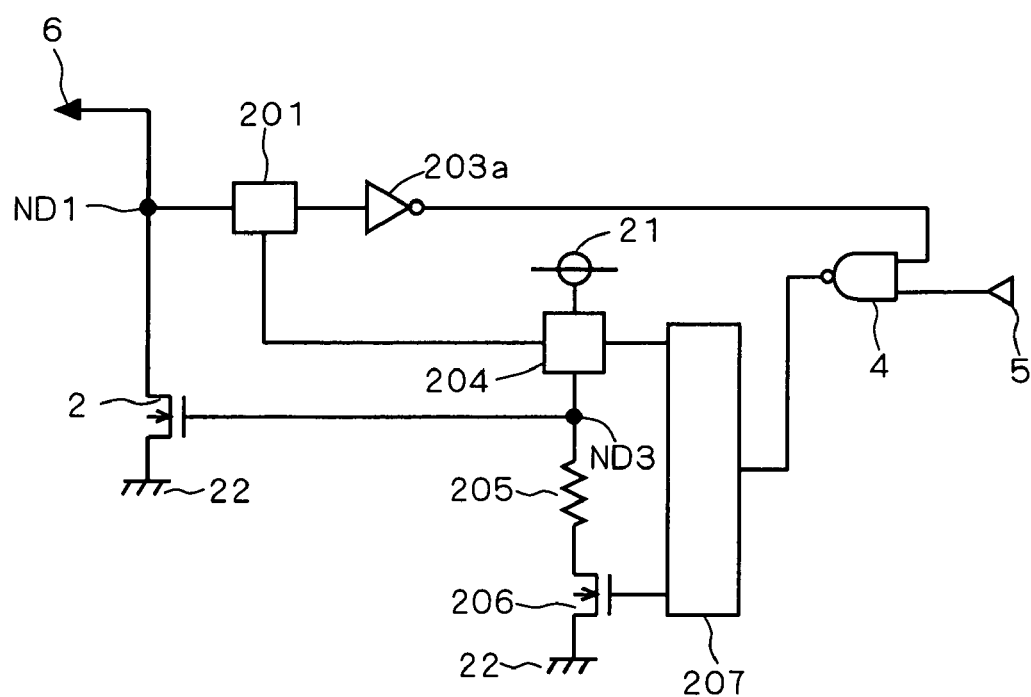

FIGS. 16 and 17 are circuit diagrams each showing a partial circuit of the switching control circuit shown in FIG. 1. The partial circuit shown in FIG. 16 only relates to the driving circuit of the PMOS 1, and the partial circuit shown in FIG. 17 only relates to the driving circuit of the NMOS 2. In the partial circuits shown in FIGS. 16 and 17, illustration of the mechanism made up of the sensors 102 and 202 shown in FIG. 1 is omitted, and the NOR circuit 103 and NAND circuit 203 shown in FIG. 1 are replaced by inverter circuits 103a and 203a, respectively.

Referring to FIG. 16, upon detection that the output potential rises above VDD-Va, the sensor 101 outputs an H signal to an input terminal of the inverter circuit 103a, and the inverter circuit 103a outputs an L signal to the second input terminal of the NOR circuit 3, and the NOR circuit 3 outputs an H signal to the gate driving circuit 107. The MOS transistors Tr1 and Tr2 shown in FIG. 2 are thereby turned on, causing the PMOS 1 to be turned on. Concerning the driving of the PMOS 1, the partial circuit shown in FIG. 16 achieves a similar effect as that of the switching control circuit shown in FIG. 1.

Referring to FIG. 17, upon detection that the output potential falls below GND+Vb, the sensor 201 outputs an L signal to an input terminal of the inverter circuit 203a, and the inverter circuit 203a outputs an H signal to the second input terminal of the NAND circuit 4, and the NAND circuit 4 outputs an L signal to the gate driving circuit 207. The MOS transistors Tr3 and Tr4 shown in FIG. 3 are thereby turned on, causing the NMOS 2 to be turned on. Concerning the driving of the NMOS 2, the partial circuit shown in FIG. 17 achieves a similar effect as that of the switching control circuit shown in FIG. 1.

While the invention has been shown and described in detail, the foregoing description is in all aspects illustrative and not restrictive. It is therefore understood that numerous modifications and variations can be devised without departing from the scope of the invention.

What is claimed is:

1. A switching control circuit, comprising:
   a first switching device connected to a power supply potential;
   a second switching device connected to a GND potential;
   an inductive load connected to a node between said first and second switching devices;
   a first detecting circuit having a first sensor connected to said node for detecting an output potential which is a potential at said node and a second sensor connected to a control node of said second switching device for detecting a first potential which is a potential at the control node; and
   a second detecting circuit having a third sensor connected to said node for detecting an output potential which is a potential at said node and a fourth sensor connected to a control node of said first switching device for detecting a second potential which is a potential at the control node;
   a first driving circuit receiving a first signal from said first detecting circuit when turning on said first switching device after turning off said second switching device, therein turning on said first switching device, said first signal indicating that said output potential rises above a third potential lower than said power supply potential by a predetermined value, wherein said first driving circuit comprises a first impedance switching circuit coupled between a control node of said first switching device and said GND potential, wherein the first impedance switching circuit receives said first signal from said first detecting circuit, wherein said first driving circuit comprises a first potential supply circuit connected between a control node of said first switching device and said power supply potential; and a second driving circuit receiving a second signal from said second detecting circuit when turning on said second switching device after turning off said first switching device, thereby turning on said second switching device, said second signal indicating that said output potential falls below a fourth potential higher than said GND potential by a predetermined value wherein said first driving circuit comprises a second impedance switching circuit connected between a control node of said second switching device and said power supply potential receiving said second signal from said detecting circuit, wherein said first driving circuit comprises a first potential supply circuit connected between a control node of said first switching device and said power supply potential, wherein said first impedance switching circuit comprises:

a first switch receiving said first signal;
a first resistor coupled to said first switch; and
a second resistor coupled to said first switch,
wherein an impedance value of said first switching circuit becomes lower when said first switch receives said first signal, wherein said second impedance switching circuit comprises:
a second switch receiving said first signal;
a third resistor connected to said second switch; and
a fourth resistor connected to said second switch;
   wherein an impedance value of said second switching circuit becomes lower when said second switch receives said second signal,
wherein said first driving circuit further comprises a third switching device and a fifth resistor serially connected between said control node of said first switching device and said power supply potential; and
   wherein said first driving circuit further comprises a fourth switching device and a sixth resistor serially connected between said control node of said second switching device and said GND potential.

2. The switching control circuit according to claim 1, wherein a resistance value of said first resistor is lower than a resistance value of said second resistor and a resistance value of said third resistor is lower than a resistance value of said fourth resistor.

* * * * *